US012341046B2

(12) United States Patent
Amikura et al.

(10) Patent No.: US 12,341,046 B2
(45) Date of Patent: Jun. 24, 2025

(54) TRANSFER APPARATUS AND TRANSFER METHOD

(71) Applicant: TOKYO ELECTRON LIMITED, Tokyo (JP)

(72) Inventors: Norihiko Amikura, Miyagi (JP); Masatomo Kita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 968 days.

(21) Appl. No.: 17/462,197

(22) Filed: Aug. 31, 2021

(65) Prior Publication Data

US 2022/0068689 A1 Mar. 3, 2022

(30) Foreign Application Priority Data

Aug. 31, 2020 (JP) ................................ 2020-145882

(51) Int. Cl.
| | |
|---|---|
| *H01L 21/68* | (2006.01) |
| *G01S 17/48* | (2006.01) |
| *H01L 21/66* | (2006.01) |
| *H01L 21/677* | (2006.01) |

(52) U.S. Cl.
CPC ............ *H01L 21/681* (2013.01); *G01S 17/48* (2013.01); *H01L 21/67742* (2013.01); *H01L 22/12* (2013.01)

(58) Field of Classification Search
CPC ............. H01L 21/681; H01L 21/67742; H01L 21/67259; H01L 21/67748; H01L 21/67766; H01L 21/67703; H01L 21/67706; H01L 22/12; G01S 17/48; G01S 17/04
See application file for complete search history.

(56) References Cited

U.S. PATENT DOCUMENTS 4,496,788 A * 1/1985 Hamakawa ........... H01L 31/078
136/258
5,290,383 A * 3/1994 Koshimizu ....... H01J 37/32935
216/60

(Continued)

FOREIGN PATENT DOCUMENTS

| JP | H11-145257 A | 5/1999 |
|---|---|---|
| JP | 2001-237300 A | 8/2001 |

(Continued)

OTHER PUBLICATIONS

JPH11145257A—Google Patents English Translation, Nov. 1997 (Year: 1997).*

*Primary Examiner* — Stephen A Vu
(74) *Attorney, Agent, or Firm* — XSENSUS LLP

(57) ABSTRACT

A transfer apparatus includes a transfer arm, an irradiator, a light receiver, and a controller. The transfer arm transfers the member. The irradiator irradiates light obliquely onto a passage area, through which the member passes, when the member is transferred by the transfer arm. The light receiver receives the light, which is irradiated from the irradiator and reflected from the member, when the member passes through the passage area. The controller determines whether the member has passed through the passage area according to whether the light irradiated from the irradiator is received by the light receiver.

14 Claims, 11 Drawing Sheets

(56) References Cited

U.S. PATENT DOCUMENTS

| | | | | |
|---|---|---|---|---|
| 6,096,496 A * | 8/2000 | Frankel | ............. | G01N 21/6452 |
| | | | | 435/7.1 |
| 2007/0228110 A1* | 10/2007 | Eldridge | ............ | G01R 1/07314 |
| | | | | 228/180.5 |
| 2010/0025592 A1* | 2/2010 | Tumer | ................. | G01T 1/2928 |
| | | | | 250/371 |

FOREIGN PATENT DOCUMENTS

| | | | |
|---|---|---|---|
| JP | 2004-282002 | A | 10/2004 |
| JP | 2007-246274 | A | 9/2007 |
| JP | 2016-514089 | A | 5/2016 |
| JP | 2019-129292 | A | 8/2019 |
| JP | 2020-96149 | A | 6/2020 |
| WO | 2014/121040 | A1 | 8/2014 |

\* cited by examiner

TRANSFER APPARATUS AND TRANSFER METHOD

CROSS-REFERENCE TO RELATED APPLICATIONS

This application claims priority to Japanese Patent Application No. 2020-145882, filed on Aug. 31, 2020, the entire contents of which are incorporated herein by reference.

TECHNICAL FIELD

Various aspects and embodiments of the present disclosure relate to a transfer apparatus and a transfer method.

BACKGROUND

For example, in Patent Document 1 below, a technique is disclosed in which, when a substrate passes between a light projector configured to project light and a light receiver configured to receive the light projected from the light projector and the light projected from the light projector is blocked, it is determined that the substrate has passed between the light projector and the light receiver.

SUMMARY

The present disclosure provides a transfer apparatus and a transfer method capable of determining whether a member such as a substrate has passed through a predetermined area in a manner different from that of the related art.

One aspect of the present disclosure provides a transfer apparatus including a transfer arm, an irradiator, a light receiver, and a controller. The transfer arm transfers the member. The irradiator irradiates light obliquely onto a passage area, through which the member passes, when the member is transferred by the transfer arm. The light receiver receives the light, which is irradiated from the irradiator and reflected from the member, when the member passes through the passage area. The controller determines whether the member has passed through the passage area according to whether the light irradiated from the irradiator is received by the light receiver.

DETAILED DESCRIPTION

Hereinafter, embodiments of a transfer apparatus and a transfer method will be described in detail with reference to the drawings. Further, the disclosed transfer apparatus and method are not limited by the following embodiments. In addition, each of the embodiments illustrated below may be appropriately combined in a range in which processing contents are not contradicted.

First Embodiment

[Configuration of Processing System 1]

Figure 1:
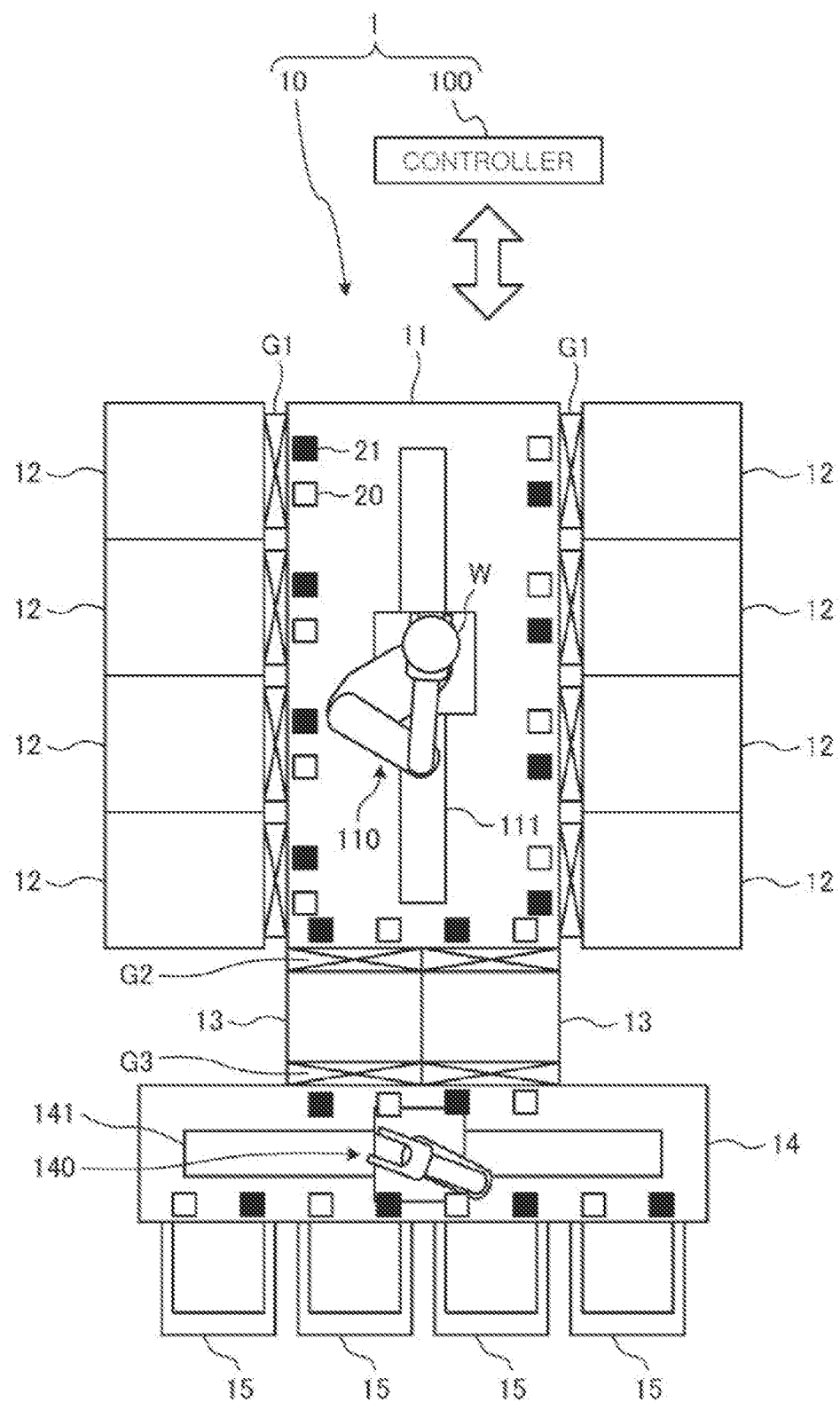
FIG. 1 is a plan view illustrating an example of a processing system according to a first embodiment.

FIG. 1 is a plan view illustrating an example of a configuration of a processing system 1 according to the first embodiment. In FIG. 1, for convenience, internal components in some devices are shown to be transparent. The processing system 1 includes a main body 10 and a controller 100 configured to control the main body 10. The processing system 1 is an example of a transfer apparatus.

The main body 10 includes a vacuum transfer module 11, a plurality of processing modules 12, a plurality of load lock modules 13, and an atmospheric transfer module 14. The plurality of processing modules 12 are connected to a side wall of the processing system 1 via gate valves G1. In addition, in the example of FIG. 1, eight processing modules 12 are connected to the vacuum transfer module 11, but the number of processing modules 12 connected to the vacuum transfer module 11 may be seven or less, or nine or more.

Each of the processing modules 12 forms elements on a substrate W by performing processes such as an etching or film-forming process or the like on the substrate W to be processed. A consumable component, such as an edge ring ER, is provided in each of the processing modules 12, and the consumable component is replaced with a new consumable component after a plurality of substrates W have been processed. The substrate W and the consumable component are one example of a member.

The plurality of load lock modules 13 are connected to another side wall of the vacuum transfer module 11 via gate valves G2. In the example of FIG. 1, two load lock modules 13 are connected to the vacuum transfer module 11, but the number of load lock modules 13 connected to the vacuum transfer module 11 may be one, or three or more. In addition, at least one of the two load lock modules 13 may accommodate the substrate W and a consumable component such as the edge ring ER. In the following description, the substrate W and the consumable component such as the edge ring ER will be described as the substrate W or the like.

A transfer arm 110 is disposed in the vacuum transfer module 11. The transfer arm 110 moves in the vacuum transfer module 11 along a guide rail 111 provided in the vacuum transfer module 11. In addition, the transfer arm 110 transfers the substrate W between the processing module 12 and another processing module 12 and between the processing module 12 and the load lock module 13. An inside of the vacuum transfer module 11 is maintained at a pressure atmosphere lower than the atmospheric pressure. Further, the transfer arm 110 may be configured to be fixed at a predetermined position in the vacuum transfer module 11 and not to move in the vacuum transfer module 11.

The vacuum transfer module 11 is connected to one side wall of each of the load lock modules 13 via the gate valve G2, and the atmospheric transfer module 14 is connected to the other side wall of each of the load lock modules 13 via a gate valve G3. When the substrate W is carried into the load lock module 13 from the atmospheric transfer module 14 through the gate valve G3, the gate valve G3 is closed, and a pressure in the load lock module 13 is lowered to a predetermined pressure from the atmospheric pressure. Then, the gate valve G2 is opened, and the substrate W in the load lock module 13 is carried out into the vacuum transfer module 11 by the transfer arm 110.

Further, in a state in which the pressure in the load lock module 13 is lower than the atmospheric pressure, the substrate W is carried into the load lock module 13 from the vacuum transfer module 11 through the gate valve G2 by the transfer arm 110, and the gate valve G2 is closed. Then, the pressure in the load lock module 13 is raised to the atmospheric pressure. Then, the gate valve G3 is opened, and the substrate W in the load lock module 13 is carried out into the atmospheric transfer module 14. The consumable component, such as the edge ring ER or the like, is carried in and out in the same manner.

A plurality of load ports 15 are provided on a sidewall of the atmospheric transfer module 14 which is opposite to the sidewall of the atmospheric transfer module 14 on which the gate valve G3 is provided. A container, such as a Front Opening Unified Pod (FOUP), capable of accommodating a plurality of substrates W is connected to each of the load ports 15. In addition, an aligner module or the like configured to change a direction of the substrate W may be provided in the atmospheric transfer module 14. In addition, a container capable of accommodating the consumable component such as the edge ring ER is connected to one of the plurality of the load ports 15.

A pressure in the atmospheric transfer module 14 is an atmospheric pressure. A transfer arm 140 is provided in the atmospheric transfer module 14. The transfer arm 140 moves in the atmospheric transfer module 14 along a guide rail 141 provided in the atmospheric transfer module 14 and transfers the substrate W or the like between the load lock module 13 and the container connected to each of the load ports 15. In addition, the transfer arm 140 may be configured to be fixed at a predetermined position in the atmospheric transfer module 14 and not to move in the atmospheric transfer module 14. A Fan Filter Unit (FFU) or the like is provided on an upper portion of the atmospheric transfer module 14, air from which particles or the like are removed is supplied into the atmospheric transfer module 14 from the upper portion, and a down flow is formed in the atmospheric transfer module 14. In addition, in the present embodiment, the inside of the atmospheric transfer module 14 is an atmospheric pressure atmosphere, but in another embodiment, the pressure in the atmospheric transfer module 14 may be controlled to be a positive pressure. Thus, it is possible to suppress the intrusion of particles or the like into the atmospheric transfer module 14 from the outside.

Further, a plurality of sets each having an irradiator 20 and a light receiver 21 are provided in the vacuum transfer module 11 and in the atmospheric transfer module 14. In the present embodiment, the set of the irradiator 20 and the light receiver 21 is provided in the vicinity of each of the gate valves G1, in the vicinity of each of the gate valves G2, in the vicinity of each of the gate valves G3, and in the vicinity of each of the load ports 15.

The irradiator 20 irradiates light obliquely onto a passage area, through which the substrate W or the like passes, when the substrate W or the like is transferred by the transfer arm 110. The light receiver 21 receives the light, which is irradiated from the irradiator 20 and reflected from the substrate W or the like, when the substrate W or the like passes through the passage area.

The controller 100 includes a memory, a processor, and an input/output interface. Data such as a recipe, a program, or the like is stored in the memory. The memory is, for example, a random-access memory (RAM), a read-only memory (ROM), a hard disk drive (HDD), a solid-state drive (SSD), or the like. The processor controls each component of the main body 10 through the input/output interface based on the data such as a recipe stored in the memory by executing the program read from the memory. The processor is a Central Processing Unit (CPU), a Digital Signal Processor (DSP), or the like.

The controller 100 controls each irradiator 20 to irradiate light and determines whether the light irradiated from each irradiator 20 is received by each light receiver 21. In addition, in accordance with whether the light irradiated from the irradiator 20 is received by the light receiver 21, the controller 100 determines whether the substrate W or the like has passed through the passage area to which the light is irradiated by the irradiator 20. For example, the controller 100 controls the irradiator 20 to irradiate light to a predetermined passage area and controls the transfer arm 110 and the transfer arm 140 to move the substrate W or the like on the basis of the data such as a recipe.

Further, when the light receiver 21 receives the light reflected from the substrate W or the like passing through the passage area, the controller 100 determines that the substrate W or the like has passed through the passage area and executes the control of a next process. In addition, when the light receiver 21 does not receive the light, the controller 100 determines that the substrate W or the like has not passed through the passage area and notifies a user or the like of the processing system 1 of an error without executing the control of a next process.

[Method of Determining Passage of Substrate W]

Figure 2:
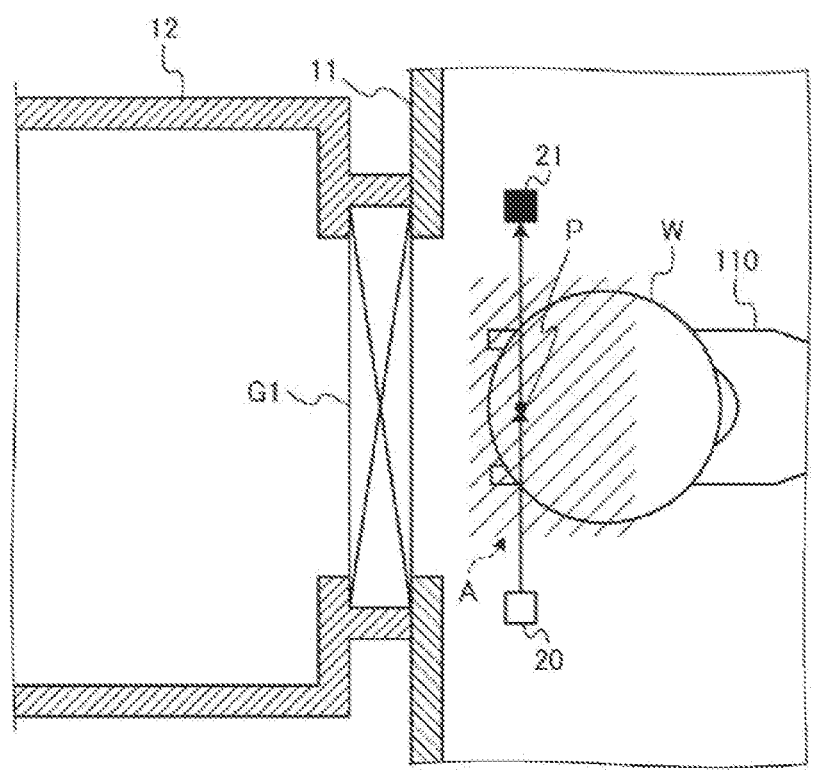
FIG. 2 is an enlarged view of the vicinity of a gate valve according to the first embodiment.
Figure 3:
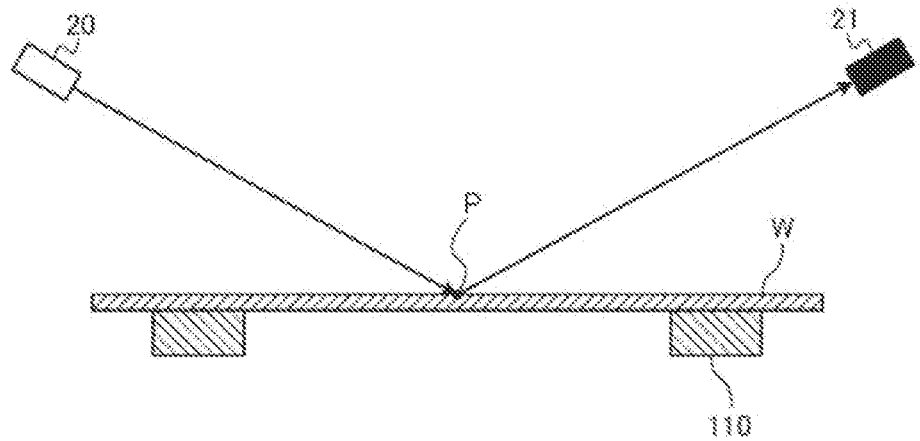
FIG. 3 shows an example of a light path of light irradiated to a substrate according to the first embodiment.

FIG. 2 is an enlarged view of the vicinity of the gate valve G1 according to the first embodiment. FIG. 3 is a view illustrating an example of a light path of light irradiated to the substrate W according to the first embodiment. In the present embodiment, the irradiator 20 irradiates light obliquely onto a passage area A through which the substrate W carried into the processing module 12 and the substrate W carried out of the processing module 12 pass. The passage area A is a plane including an upper surface of the substrate W or the like at the time of being transferred by the transfer arm 110. In the present embodiment, the irradiator 20 is a semiconductor laser that irradiates, for example, a laser beam.

When the substrate W passes through the passage area A, for example, as shown in FIG. 3, the light irradiated from the irradiator 20 to the passage area A is reflected at a reflection position P on the substrate W and is incident on the light receiver 21. On the other hand, when the substrate W does not pass through the passage area A, the light irradiated from the irradiator 20 to the passage area A is not reflected from the substrate W and is not incident on the light receiver 21. The light receiver 21 outputs an electrical signal corresponding to the intensity of the incident light to the controller 100. The light receiver 21 is, for example, a photo transistor.

In the present embodiment, for example, as shown in FIG. 3, the irradiator 20 and the light receiver 21 are disposed on the same surface side of the substrate W with respect to the substrate W passing through the passage area A. Thus, the maintenance of the irradiator 20 and the light receiver 21 may be easily performed.

The controller 100 determines that the substrate W has passed through the passage area A when the light irradiated from the irradiator 20 is received by the light receiver 21 and determines that the substrate W does not pass through the passage area A when the light irradiated from the irradiator 20 is not received by the light receiver 21. Thus, the controller 100 may perform a process based on a recipe on the substrate W while confirming a position of the substrate W.

Figure 4:
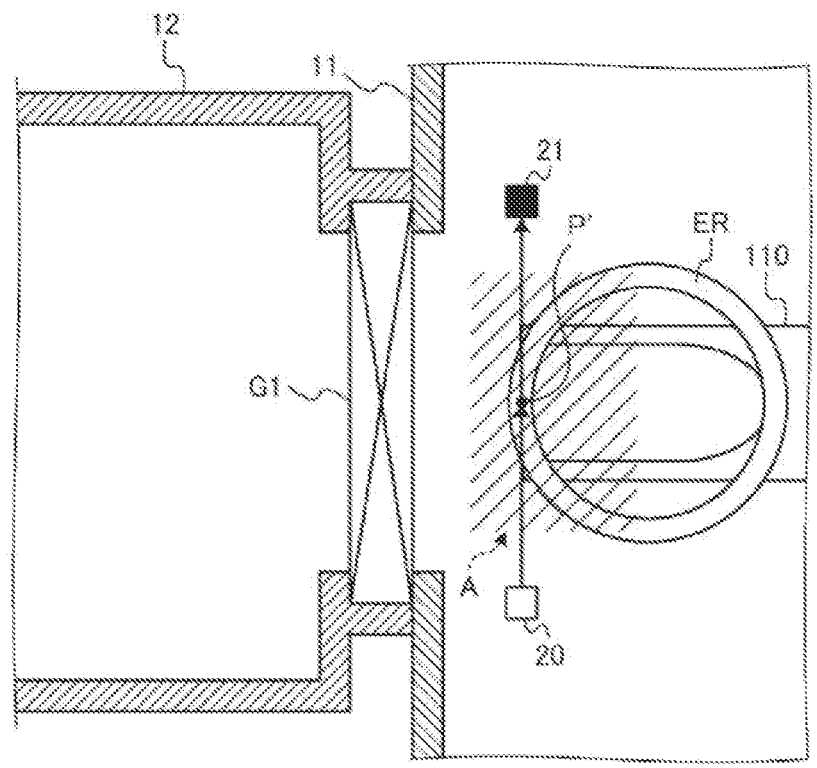
FIG. 4 is an enlarged view of the vicinity of the gate valve according to the first embodiment.

In addition, even for the consumable component such as the edge ring ER, for example, as shown in FIG. 4, when the consumable component passes through the passage area A, the light irradiated from the irradiator 20 to the passage area A is reflected at a reflection position P' on the consumable component and is incident on the light receiver 21. Thus, the controller 100 may determine that the consumable component has passed through the passage area A when the light irradiated from the irradiator 20 is received by the light receiver 21. In addition, the controller 100 may determine that the consumable component has not passed through the passage area A when the light irradiated from the irradiator 20 is not received by the light receiver 21.

In the above, the first embodiment has been described. As described above, the processing system 1 according to the present embodiment includes the transfer arm 110, the irradiator 20, the light receiver 21, and the controller 100. The transfer arm 110 transfers the substrate W or the like. The irradiator 20 irradiates light obliquely onto the passage area A, through which the substrate W or the like passes, when the substrate W or the like is transferred by the transfer arm 110. The light receiver 21 receives the light, which is irradiated from the irradiator 20 and reflected from the substrate W or the like, when the substrate W or the like passes through the passage area A. The controller 100 determines whether the substrate W or the like has passed through the passage area A according to whether the light irradiated from the irradiator 20 is received by the light receiver 21. Thus, it is possible to determine whether the substrate W or the like has passed through a predetermined area by a method different from a conventional method.

Further, in the first embodiment described above, both the irradiator 20 and the light receiver 21 are disposed on the same surface side of the substrate W when the substrate W passes through the passage area A. Thus, the maintenance of the irradiator 20 and the light receiver 21 may be easily performed.

Second Embodiment

In the first embodiment, it is determined whether the substrate W or the like has passed through the passage area A by determining whether the light receiver 21 receives the light irradiated from the irradiator 20 to the passage area A. On the other hand, in the present embodiment, the reference position of the substrate W or the like is specified on the basis of a light-receiving time in the light receiver 21. In addition, the substrate W or the like is transferred to a transfer destination (e.g., in a chamber of the processing module 12 or the like) such that the specified reference position is disposed at a reference position of the transfer destination. Thus, it is not necessary to separately provide a sensor for specifying a position of the substrate W or the like, and an increase in the overall size of the processing system 1 may be suppressed.

Figure 5:
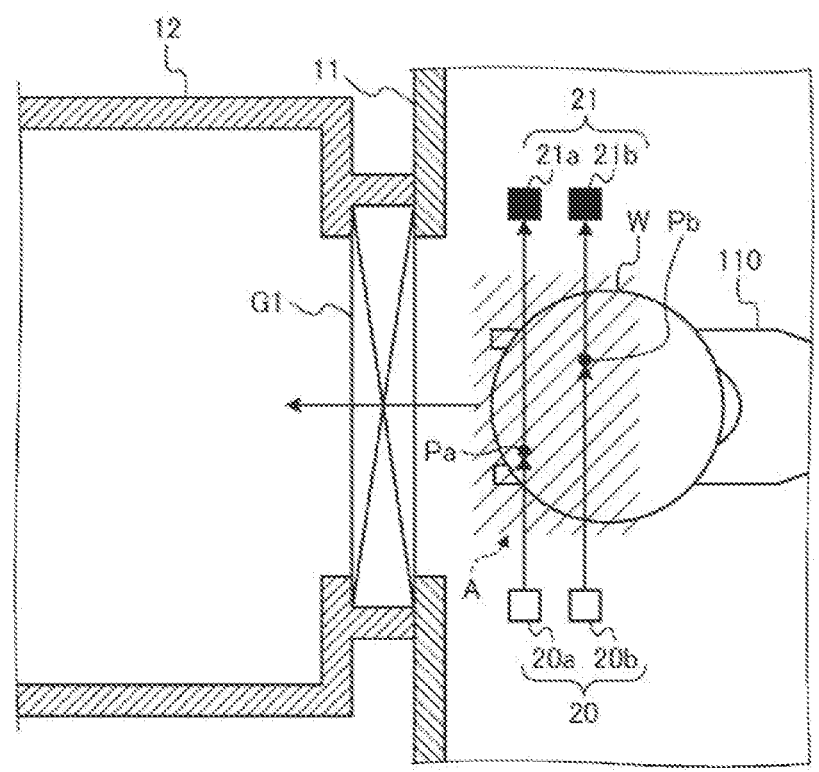
FIG. 5 is an enlarged view of the vicinity of a gate valve according to a second embodiment.
Figure 6:
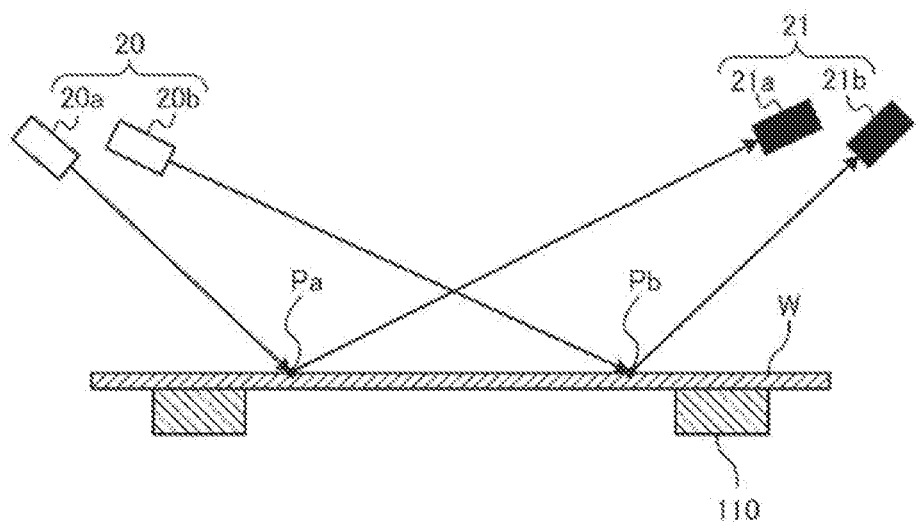
FIG. 6 shows an example of a light path of light irradiated to a substrate according to the second embodiment.

FIG. 5 is an enlarged view of the vicinity of a gate valve G1 according to the second embodiment. FIG. 6 shows an example of a light path of light irradiated to a substrate W according to the second embodiment. In the present embodiment, an irradiator 20 includes an irradiator 20a and an irradiator 20b, and a light receiver 21 includes a light receiver 21a and a light receiver 21b. The irradiator 20a is an example of a first irradiator, and the irradiator 20b is an example of a second irradiator. In addition, the light receiver 21a is an example of a first light receiver, and the light receiver 21b is an example of a second light receiver. The irradiator 20a, the irradiator 20b, the light receiver 21a, and the light receiver 21b are provided in the vicinity of each gate valve G1. In addition, the irradiator 20a, the irradiator 20b, the light receiver 21a, and the light receiver 21b may also be provided in the vicinity of each gate valve G2 and in the vicinity of each gate valve G3.

In the present embodiment, each of the irradiator 20a and the irradiator 20b irradiates light obliquely onto the passage area A. When the substrate W passes through the passage area A, for example, as shown in FIG. 6, the light irradiated from the irradiator 20a to the passage area A is reflected at a reflection position Pa on the substrate W and is incident on the light receiver 21a. In addition, when the substrate W passes through the passage area A, the light irradiated from the irradiator 20b to the passage area A is reflected at a reflection position Pb on the substrate W and is incident on the light receiver 21b. A controller 100 determines whether the substrate W has passed through the passage area A by determining whether the light receiver 21a receives the light irradiated from the irradiator 20a to the passage area A or whether the light receiver 21b receives the light irradiated from the irradiator 20b to the passage area A.

Further, the controller 100 specifies a movement amount of the substrate W when the substrate W passes through the passage area A on the basis of a control amount of a transfer arm 110. In addition, the controller 100 specifies a light-receiving time of each of the light receiver 21a and the light receiver 21b when the substrate W passes through the passage area A. In addition, the controller 100 specifies a reference position O (e.g., a center of the substrate W) of the substrate W on the basis of the specified movement amount of the substrate W and the specified light-receiving time of each of the light receiver 21a and the light receiver 21b.

Figure 7:
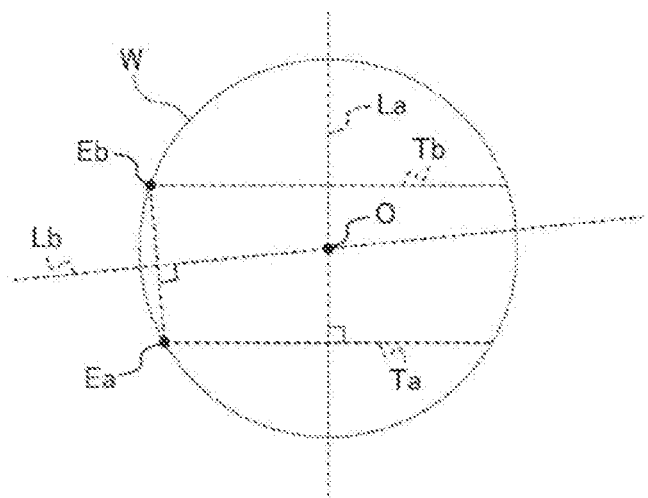
FIG. 7 shows an example of a method for specifying a reference position of the substrate.

For example, as shown in FIG. 7, the controller 100 specifies a line segment Ta indicating a locus of the reflection position Pa and a line segment Tb indicating a locus of the reflection position Pb. In addition, the controller 100 specifies a straight line La that is a vertical bisector of the line segment Ta. In addition, the controller 100 specifies a straight line Lb that is a vertical bisector of a line segment connecting an end point Ea of the line segment Ta and an end point Eb of the line segment Tb. In addition, the controller 100 specifies an intersection of the straight line La and the straight line Lb as the reference position O of the substrate W.

Further, the controller 100 controls the transfer arm 110 and carries the substrate W into a processing module 12 such that the specified reference position O of the substrate W is disposed at a predetermined position (e.g., a center of a placement table on which the substrate W is placed) in a chamber of the processing module 12. Thus, the substrate W may be carried into a predetermined position in the processing module 12, and variations in processing between the substrates W may be suppressed.

[Transfer Method]

Figure 8:
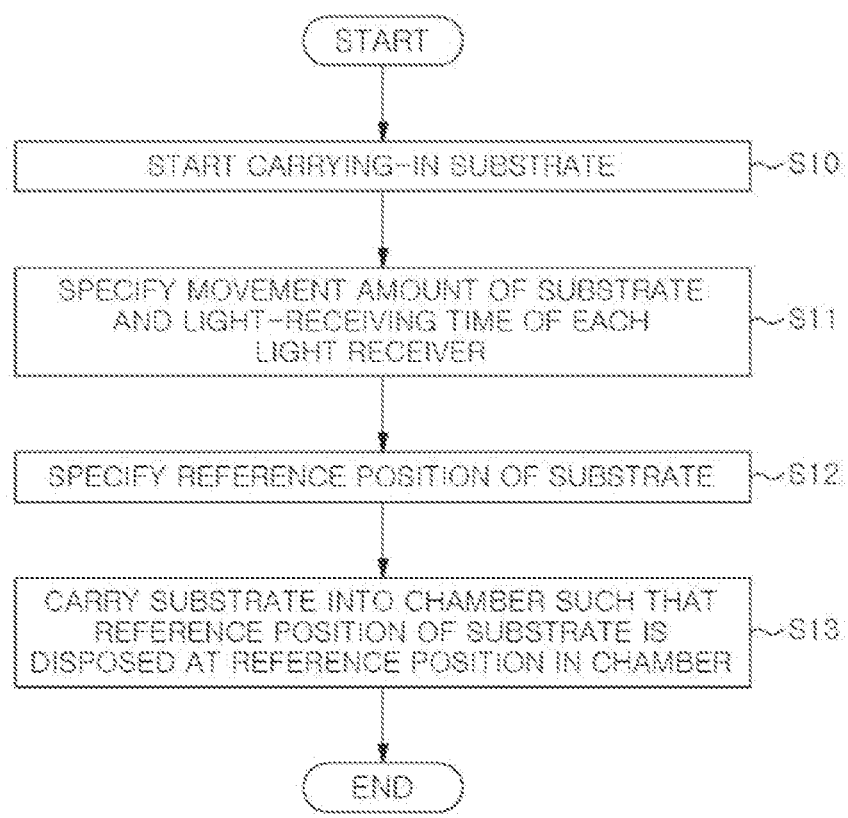
FIG. 8 is a flowchart illustrating an example of a transfer method according to the second embodiment.

FIG. 8 is a flowchart illustrating an example of a transfer method according to the second embodiment. A process illustrated in FIG. 8 is implemented by controlling each component of the main body 10 by the controller 100. In addition, in FIG. 8, a process when a substrate W is carried into a processing module 12 is illustrated.

First, the controller 100 controls an irradiator 20a and an irradiator 20b to irradiate light obliquely onto a passage area A in the vicinity of the gate valve G1 and opens the gate valve G1. In addition, the controller 100 controls the transfer arm 110 to start carrying the substrate W into the processing module 12 (S10). In addition, the light receiver 21a and the light receiver 21b receive the light reflected from the substrate W passing through the passage area A. When the light receiver 21a receives light irradiated from the irradiator 20a or when the light receiver 21b receives light irradiated from the irradiator 20b, the controller 100 determines that the substrate W has passed through the passage area A.

Next, the controller 100 specifies a movement amount of the substrate W and a light-receiving time of each of the light receiver 21a and the light receiver 21b on the basis of a control amount of the transfer arm 110 and an electrical signal outputted from each of the light receiver 21a and the light receiver 21b (S11).

Next, the controller 100 specifies a reference position O of the substrate W on the basis of the specified movement amount of the substrate W and the specified light-receiving time of each of the light receiver 21a and the light receiver 21b through the procedure described in FIG. 7 (S12).

Next, the controller 100 controls the transfer arm 110 to carry the substrate W into a chamber such that the specified reference position O is disposed at a reference position in the chamber of the processing module 12 (S13). In addition, the transfer arm 110 is taken out of the inside of the chamber, the gate valve G1 is closed, and the process shown in the flowchart is ended.

In the above, the second embodiment has been described. As described above, in the present embodiment, the irradiator 20 includes the irradiator 20a and the irradiator 20b. When the substrate W is carried into the chamber of the processing module 12, which is connected to a vacuum transfer module 11 in which the transfer arm 110 is provided, from the vacuum transfer module 11, the irradiator 20a irradiates light to a partial area (e.g., a first partial area) in the passage area A through which the substrate W passes. The irradiator 20b irradiates light to another partial area (e.g., a second partial area) in the passage area A through which the substrate W passes when the substrate W is carried into the chamber of the processing module 12 from the vacuum transfer module 11. The light receiver 21 includes the light receiver 21a and the light receiver 21b. The light receiver 21a receives the light irradiated from the irradiator 20a and reflected from the substrate W passing through a partial area in the passage area A. The light receiver 21b receives the light irradiated from the irradiator 20b and reflected from the substrate W passing through another partial area in the passage area A. The controller 100 specifies a reference position of the substrate W while controlling the transfer arm 110 to pass the substrate W through the passage area A on the basis of a movement amount of the substrate W, a light-receiving time of the light receiver 21a, and a light-receiving time of the light receiver 21b. In addition, the controller 100 controls the transfer arm 110 to carry the substrate W into the chamber of the processing module 12 such that the specified reference position is disposed at a predetermined position in the chamber of the processing module 12. Thus, variations in the processing between the substrates W may be suppressed.

Third Embodiment

In a conventional determination method using a light-shielding sensor, a light path is blocked by a substrate W or the like, thereby determining that the substrate W or the like has passed through an area in which the light path is formed. However, in this method, when the substrate W or the like is carried into any one of devices arranged in series in a vertical direction, it is difficult to distinguish and determine which device the substrate W has been carried into. On the other hand, in the present embodiment, it is possible to distinguish and determine which of the devices arranged in series in the vertical direction the substrate W or the like has been carried into. Similarly, in carrying out of the substrate W, the determination is made by being distinguished. Thus, it is possible to more accurately determine whether a member such as the substrate W has passed through a predetermined area.

Figure 9:
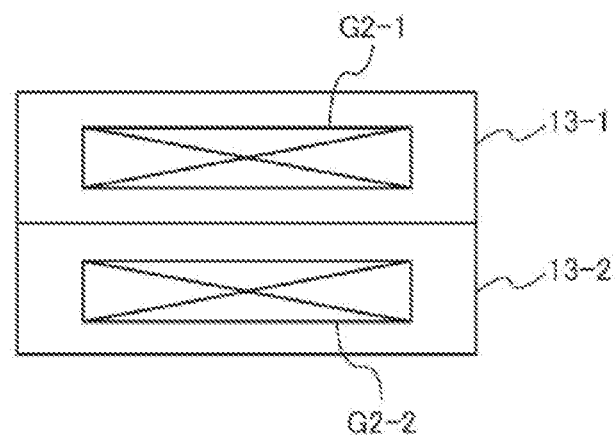
FIG. 9 is a side view illustrating an example of a load lock module according to a third embodiment.

In the present embodiment, as shown in FIG. 9, for example, a load lock module 13-1 and a load lock module 13-2 are arranged adjacent to each other in the vertical direction. FIG. 9 is a side view illustrating an example of the load lock modules 13-1 and 13-2 according to the third embodiment. A footprint of a processing system 1 is reduced by arranging the load lock module 13-1 and the load lock module 13-2 adjacent to each other in the vertical direction. In addition, the number of load lock modules 13 arranged adjacent to each other in the vertical direction may be three or more. Further, the devices arranged in series in the vertical direction may be two processing modules 12 and may also be the processing module 12 and the load lock module 13. In the example of FIG. 9, the load lock module 13-1 is an example of a first chamber, and the load lock module 13-2 is an example of a second chamber.

Figure 10:
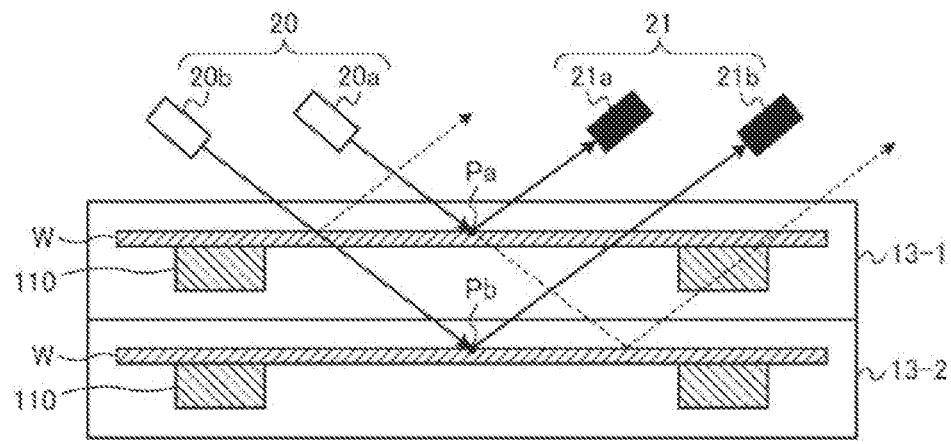
FIG. 10 shows an example of a light path of light irradiated to a substrate according to the third embodiment.

FIG. 10 shows an example of a light path of light irradiated to a substrate W according to the third embodiment. In the present embodiment, an irradiator 20 includes an irradiator 20a and an irradiator 20b, and a light receiver 21 includes a light receiver 21a and a light receiver 21b. The irradiator 20a, the irradiator 20b, the light receiver 21a, and the light receiver 21b are provided in the vicinity of each gate valve G1. In addition, the irradiator 20a, the irradiator 20b, the light receiver 21a, and the light receiver 21b may also be provided in the vicinity of each gate valve G2 and in the vicinity of each gate valve G3.

In the present embodiment, the irradiator 20a irradiates light obliquely onto a passage area A in the vicinity of the load lock module 13-1, and the irradiator 20b irradiates light obliquely onto a passage area A in the vicinity of the load lock module 13-2. When the substrate W is carried into the load lock module 13-1, for example, as shown by a solid-line arrow in FIG. 10, the light irradiated from the irradiator 20a to the passage area A is reflected at a reflection position Pa on the substrate W passing through the passage area A and is incident on the light receiver 21a. The passage area A through which the substrate W passes when being carried into the load lock module 13-1 is an example of a first passage area.

On the other hand, when the substrate W is carried into the load lock module 13-2, for example, as shown by a dashed-line arrow in FIG. 10, the light irradiated from the irradiator 20*a* to the passage area A is reflected from the substrate W passing through the passage area A but is not incident on the light receiver 21*a*. Thus, the controller 100 may determine that the substrate W has passed through the passage area A by detecting that the light receiver 21*a* receives the light. The passage area A through which the substrate W passes when being carried into the load lock module 13-2 is an example of a second passage area. In addition, even when the substrate W is carried out of the load lock module 13-1, the controller 100 may determine whether the substrate W has passed through the passage area A in a similar manner.

Further, when the substrate W is carried into the load lock module 13-2, for example, as shown by a solid-line arrow in FIG. 10, the light irradiated from the irradiator 20*b* to the passage area A is reflected at a reflection position Pb on the substrate W passing through the passage area A and is incident on the light receiver 21*b*. On the other hand, when the substrate W is carried into the load lock module 13-1, for example, as shown by a dashed-line arrow in FIG. 10, the light irradiated from the irradiator 20*b* to the passage area A is reflected from the substrate W passing through the passage area A but is not incident on the light receiver 21*b*. Thus, the controller 100 may determine that the substrate W has passed through the passage area A by detecting that the light receiver 21*b* receives the light. In addition, even when the substrate W is carried out of the load lock module 13-2, the controller 100 may determine whether the substrate W has passed through the passage area A in a similar manner.

Figure 11:
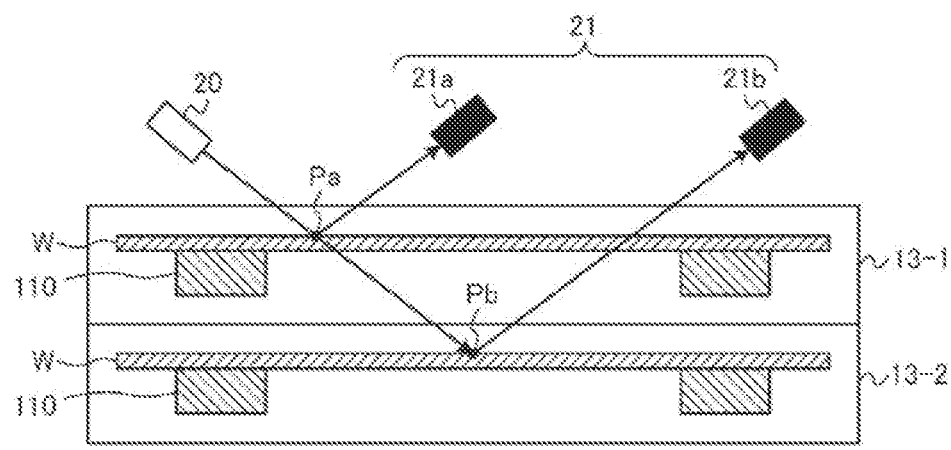
FIG. 11 shows another example of the light path of the light irradiated to the substrate according to the third embodiment.

Further, as another example, the controller 100 may determine into which one of the load lock modules 13-1 and 13-2 the substrate W is carried by determining which one of the light receiver 21*a* and the light receiver 21*b* receives the light irradiated from one irradiator 20. FIG. 11 shows another example of the light path of the light irradiated to the substrate W according to the third embodiment. In the example of FIG. 11, the light receiver 21*a* is an example of a third light receiver, and the light receiver 21*b* is an example of a fourth light receiver.

When the substrate W is carried into the load lock module 13-1, for example, as shown in FIG. 11, light irradiated from the irradiator 20 to the passage area A in the vicinity of the load lock module 13-1 is reflected at a reflection position Pa on the substrate W and is incident on the light receiver 21*a*. In this case, the light reflected from the substrate W is not incident on the light receiver 21*b*. Thus, the controller 100 may determine that the substrate W has passed through the passage area A in the vicinity of the load lock module 13-1 by detecting that the light receiver 21*a* receives the light. In addition, even when the substrate W is carried out of the load lock module 13-1, the controller 100 may determine whether the substrate W has passed through the passage area A in the vicinity of the load lock module 13-1 in a similar manner.

Meanwhile, when the substrate W is carried into the load lock module 13-2, for example, as shown in FIG. 11, the light irradiated from the irradiator 20 to the passage area A in the vicinity of the load lock module 13-2 is reflected at a reflection position Pb on the substrate W and is incident on the light receiver 21*b*. In this case, the light reflected from the substrate W is not incident on the light receiver 21*a*. Thus, the controller 100 may determine that the substrate W has passed through the passage area A in the vicinity of the load lock module 13-2 by detecting that the light receiver 21*b* receives the light. In addition, even when the substrate W is carried out of the load lock module 13-2, the controller 100 may determine whether the substrate W has passed through the passage area A in the vicinity of the load lock module 13-2 in a similar manner. Even in such a configuration, it is possible to distinguish and determine into which one of the load lock modules 13 arranged in series in the vertical direction the substrate W or the like is carried. Further, in the configuration illustrated in FIG. 11, the number of irradiators 20 may be reduced.

Figure 12:
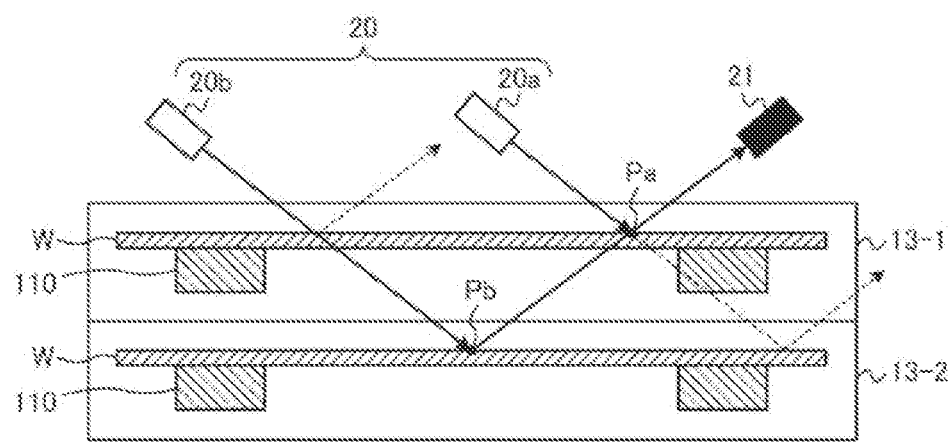
FIG. 12 shows still another example of the light path of the light irradiated to the substrate according to the third embodiment.

Further, as another example, the controller 100 may determine which one of the load lock modules 13-1 and 13-2 the substrate W has been carried into by detecting which one of the irradiator 20*a* and the irradiator 20*b* has irradiated the light received by one light receiver 21. FIG. 12 shows still another example of the light path of the light irradiated to the substrate W according to the third embodiment.

When the substrate W is carried into the load lock module 13-1, for example, as shown by a solid-line arrow in FIG. 11, light irradiated from the irradiator 20*a* to the passage area A in the vicinity of the load lock module 13-1 is reflected at a reflection position Pa on the substrate W and is incident on the light receiver 21. On the other hand, for example, as shown by a dashed-line arrow in FIG. 12, light irradiated from the irradiator 20*b* to the passage area A in the vicinity of the load lock module 13-1 is reflected from the substrate W but is not incident on the light receiver 21.

Meanwhile, when the substrate W is carried into the load lock module 13-2, for example, as shown by a solid-line arrow in FIG. 12, the light irradiated from the irradiator 20*b* to the passage area A in the vicinity of the load lock module 13-2 is reflected at a reflection position Pb on the substrate W and is incident on the light receiver 21. On the other hand, for example, as shown by a dashed-line arrow in FIG. 12, the light irradiated from the irradiator 20*a* to the passage area A in the vicinity of the load lock module 13-2 is reflected from the substrate W but is not incident on the light receiver 21.

The controller 100 controls the irradiation of light by the irradiator 20*a* and the irradiation of light by the irradiator 20*b* to be performed at different timings and determines at which timing the light receiver 21 receives the light. Thus, the controller 100 may determine which one of the irradiator 20*a* and the irradiator 20*b* has irradiated the received light. Even in such a configuration, it is possible to distinguish and determine into which one of the load lock modules 13 arranged in series in the vertical direction the substrate W or the like is carried. Further, in the configuration illustrated in FIG. 12, the number of light receivers 21 may be reduced.

Fourth Embodiment

When two devices are arranged adjacent to each other in a horizontal direction, in a conventional determination method using a light-shielding sensor, a set of an irradiator 20 and a light receiver 21 for determining whether a substrate W or the like is carried into the device is provided for each passage area A. On the other hand, in the present embodiment, one irradiator 20 is provided, and a light receiver 21 for determining whether a substrate W or the like is carried into the device is provided for each passage area A. Thus, the number of irradiators 20 may be reduced.

Figure 13:
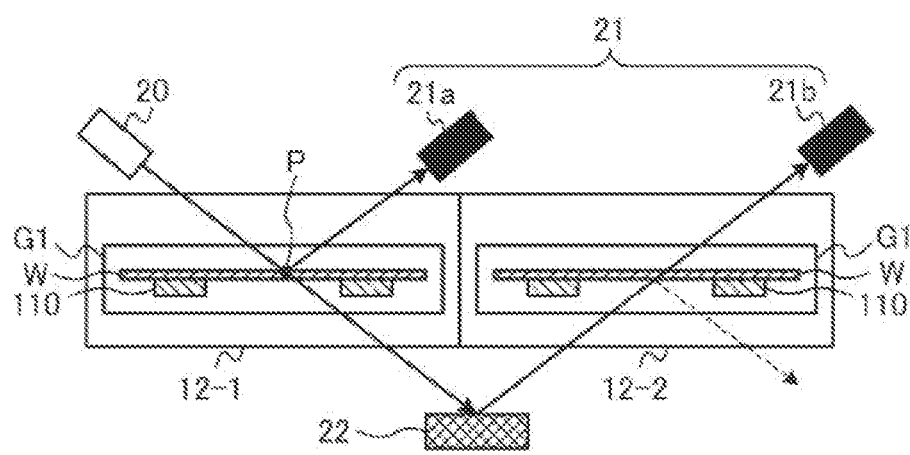
FIG. 13 shows an example of a light path of light irradiated to a substrate according to a fourth embodiment.

FIG. 13 shows an example of a light path of light irradiated to a substrate W according to the fourth embodiment. In the present embodiment, a processing module 12-1 and a processing module 12-2 are arranged in series in the horizontal direction. In addition, in the present embodiment, a mirror 22 for reflecting light irradiated from the irradiator 20 is provided. The light receiver 21 includes a light receiver 21a and a light receiver 21b. The irradiator 20, the light receiver 21a, the light receiver 21b, and the mirror 22 are provided in the vicinity of each gate valve G1. In addition, the irradiator 20, the light receiver 21a, the light receiver 21b, and the mirror 22 may also be provided in the vicinity of each gate valve G2 and in the vicinity of each gate valve G3. Further, the devices arranged in series in the horizontal direction may be two load lock modules 13 and may also be the processing module 12 and the load lock module 13.

When the substrate W is carried into the processing module 12-1, for example, as shown in FIG. 13, light irradiated from the irradiator 20 to a passage area A in the vicinity of the processing module 12-1 is reflected at a reflection position P on the substrate W and is incident on the light receiver 21a. In this case, the light irradiated from the irradiator 20 is not incident on the mirror 22 and the light receiver 21b. When the light is received by the light receiver 21a but is not received by the light receiver 21b, the controller 100 may determine that the substrate W has passed through the passage area A in the vicinity of the processing module 12-1. In addition, even when the substrate W is carried out of the processing module 12-1, the controller 100 may determine whether the substrate W has passed through the passage area A in the vicinity of the processing module 12-1 in a similar manner.

Meanwhile, when the substrate W is carried into the processing module 12-2, for example, as shown in FIG. 13, the light irradiated from the irradiator 20 to the passage area A in the vicinity of the processing module 12-1 is incident on the mirror 22. Accordingly, the light irradiated from the irradiator 20 to the passage area A in the vicinity of the processing module 12-1 is not incident on the light receiver 21a. Further, the light incident on the mirror 22 is reflected from the mirror 22 but blocked by the substrate W passing through a passage area A in the vicinity of the processing module 12-2 and is not incident on the light receiver 21b. When any one of the light receiver 21a and the light receiver 21b does not receive the light, the controller 100 may determine that the substrate W has passed through the passage area A in the vicinity of the processing module 12-2. In addition, even when the substrate W is carried out of the processing module 12-2, the controller 100 may determine whether the substrate W has passed through the passage area A in the vicinity of the processing module 12-2 in a similar manner.

A processing system 1 according to the present embodiment includes the light receiver 21a and the light receiver 21b, and the mirror 22 configured to reflect the light irradiated from the irradiator 20 to one of the light receiver 21a and the light receiver 21b. The mirror 22 is an example of a reflector. Thus, in the processing system 1 of the present embodiment, the number of irradiators 20 may be reduced as compared with a conventional determination method.

Figure 14:
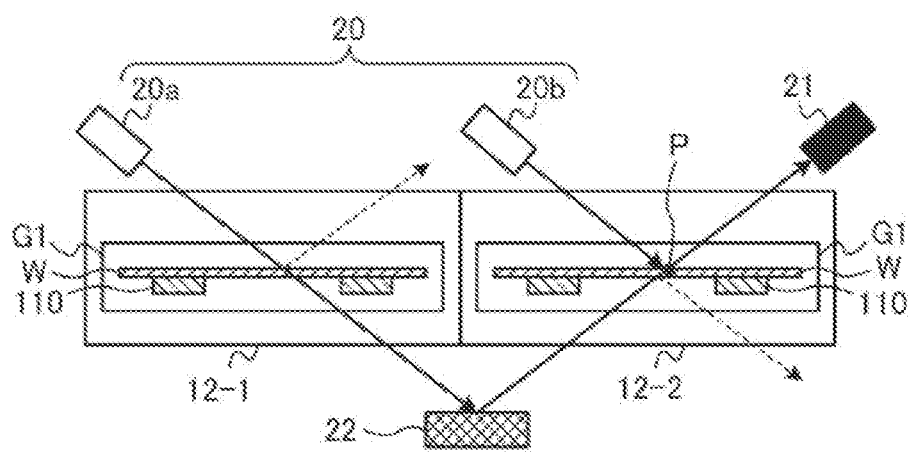
FIG. 14 shows another example of the light path of the light irradiated to the substrate according to the fourth embodiment.

In addition, as another example, as shown in FIG. 14, for example, it may be determined which one of the processing modules 12-1 and 12-2 the substrate W has been carried into by determining which one of the irradiator 20a and the irradiator 20b has irradiated the light received by one light receiver 21. FIG. 14 shows another example of the light path of the light irradiated to the substrate W according to the fourth embodiment.

For example, as shown by a dashed-line arrow in FIG. 14, when the substrate W is carried into the processing module 12-1, light irradiated from the irradiator 20a to a passage area A in the vicinity of the processing module 12-1 is blocked by the substrate W passing through the passage area A so that the light is not incident on the mirror 22. Thus, the light irradiated from the irradiator 20a is not received by the light receiver 21.

Further, for example, as shown by a solid-line arrow in FIG. 14, when the substrate W is carried into the processing module 12-2, light irradiated from the irradiator 20b to a passage area A in the vicinity of the processing module 12-2 is reflected at a reflection position P on the substrate W passing through the passage area A and is incident on the light receiver 21. Meanwhile, for example, as shown by a dashed-line arrow in FIG. 14, the light irradiated from the irradiator 20a is reflected from the mirror 22 but is blocked by the substrate W passing through the passage area A in the vicinity of the processing module 12-2 so that the light is not incident on the light receiver 21.

The controller 100 controls the irradiation of light by the irradiator 20a and the irradiation of light by the irradiator 20b to be performed at different timings and determines at which timing the light receiver 21 receives the light. When the light receiver 21 does not receive the light irradiated from any one of the irradiator 20a and the irradiator 20b, the controller 100 may determine that the substrate W has passed through the passage area A in the vicinity of the processing module 12-1. On the other hand, when the light receiver 21 receives the light irradiated from the irradiator 20b, the controller 100 may determine that the substrate W has passed through the passage area A in the vicinity of the processing module 12-2. In addition, when the light receiver 21 receives the light irradiated from the irradiator 20a, the controller 100 may determine that the substrate W has not passed through any one of the passage area A in the vicinity of the processing module 12-1 and the passage area A in the vicinity of the processing module 12-2. In the configuration illustrated in FIG. 14, the number of light receivers 21 may be reduced as compared with a conventional determination method.

Figure 15:
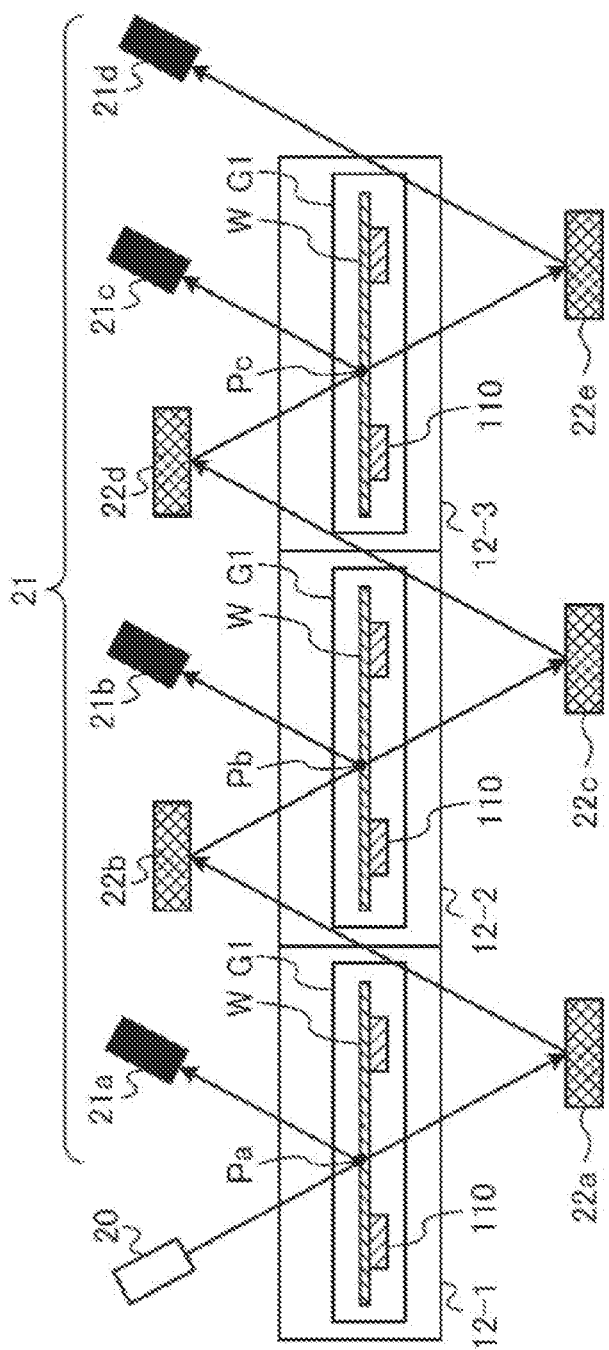
FIG. 15 shows still another example of the light path of the light irradiated to the substrate according to the fourth embodiment.

Further, the determination method of the present embodiment may be applied even in a case in which three or more devices such as the processing module 12 and the load lock module 13 are arranged adjacent to each other in the horizontal direction. FIG. 15 shows still another example of the light path of the light irradiated to the substrate W according to the fourth embodiment. In the example of FIG. 15, the light receiver 21 includes a light receiver 21a, a light receiver 21b, a light receiver 21c, and a light receiver 21d. In addition, in the example of FIG. 15, a mirror 22a, a mirror 22b, a mirror 22c, a mirror 22d, and a mirror 22e are provided.

When the substrate W is carried into the processing module 12-1, for example, as shown in FIG. 15, light irradiated from the irradiator 20 to a passage area A in the vicinity of the processing module 12-1 is reflected at a reflection position Pa on the substrate W passing through the passage area A and is incident on the light receiver 21a. In this case, the light irradiated from the irradiator 20 is not incident on the light receiver 21b, the light receiver 21c, and the light receiver 21d. The controller 100 may determine that the substrate W has passed through the passage area A in the vicinity of the processing module 12-1 when the light is received by the light receiver 21a. In addition, even when the substrate W is carried out of the processing module 12-1, the controller 100 may determine whether the substrate W has passed through the passage area A in the vicinity of the processing module 12-1 in a similar manner.

Further, when the substrate W is carried into the processing module 12-2, for example, as shown in FIG. 15, the light irradiated from the irradiator 20 to the passage area A in the vicinity of the processing module 12-1 is reflected from the mirror 22a and the mirror 22b. The light reflected from the mirror 22a and the mirror 22b is irradiated to a passage area A in the vicinity of the processing module 12-2. The light irradiated to the passage area A in the vicinity of the processing module 12-2 is reflected at a reflection position Pb on the substrate W passing through the passage area A and is incident on the light receiver 21b. In this case, the light irradiated from the irradiator 20 is not incident on the light receiver 21a, the light receiver 21c, and the light receiver 21d. The controller 100 may determine that the substrate W has passed through the passage area A in the vicinity of the processing module 12-2 when the light is received by the light receiver 21b. In addition, even when the substrate W is carried out of the processing module 12-2, the controller 100 may determine whether the substrate W has passed through the passage area A in the vicinity of the processing module 12-2 in a similar manner.

Further, when the substrate W is carried into a processing module 12-3, for example, as shown in FIG. 15, the light irradiated from the irradiator 20 to the passage area A in the vicinity of the processing module 12-1 is reflected from the mirrors 22a to 22d and irradiated to a passage area A in the vicinity of the processing module 12-3. The light irradiated to the passage area A in the vicinity of the processing module 12-3 is reflected at a reflection position Pc on the substrate W passing through the passage area A and is incident on the light receiver 21c. In this case, the light irradiated from the irradiator 20 is not incident on the light receiver 21a, the light receiver 21b, and the light receiver 21d. The controller 100 may determine that the substrate W has passed through the passage area A in the vicinity of the processing module 12-3 when the light is received by the light receiver 21c. In addition, even when the substrate W is carried out of the processing module 12-3, the controller 100 may determine whether the substrate W has passed through the passage area A in the vicinity of the processing module 12-3 in a similar manner.

Further, when the light irradiated from the irradiator 20 is received by the light receiver 21d, the controller 100 may determine that the substrate W has not passed through any passage area A in the vicinity of the processing module 12-1, in the vicinity of the processing module 12-2, and in the vicinity of the processing module 12-3. Even in the configuration shown in FIG. 15, the number of irradiators 20 may be reduced as compared with a conventional determination method. In addition, when the light irradiated from the irradiator 20 is not received by any one of the light receivers 21a to 21c, the controller 100 may determine that the substrate W has not passed through any passage area A. In this case, the mirror 22e and the light receiver 21d are unnecessary.

Figure 16:
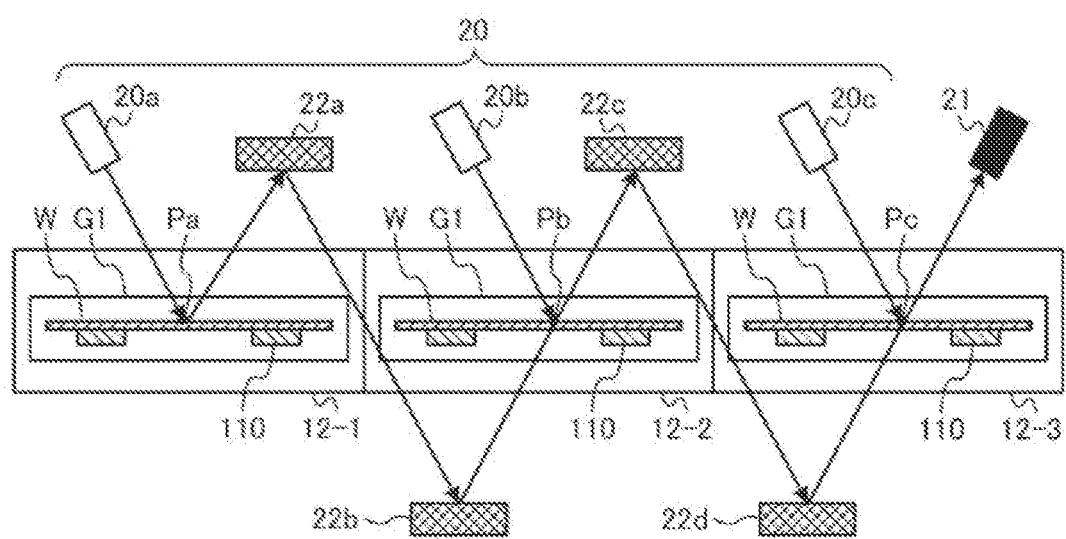
FIG. 16 shows yet another example of the light path of the light irradiated to the substrate according to the fourth embodiment.

Further, as another example, as shown in FIG. 16, for example, it may be determined which one of the processing modules 12-1 to 12-3 the substrate W has been carried into by determining which one of the irradiators 20a to 20c has irradiated the light received by one light receiver 21. FIG. 16 shows yet another example of the light path of the light irradiated to the substrate W according to the fourth embodiment.

When the substrate W is carried into the processing module 12-1, for example, as shown in FIG. 16, light irradiated from the irradiator 20a to a passage area A in the vicinity of the processing module 12-1 is reflected at a reflection position Pa on the substrate W passing through the passage area A. The light reflected at the reflection position Pa is reflected from each of the mirrors 22a to 22d and is incident on the light receiver 21. On the other hand, light irradiated from the irradiator 20b to a passage area A in the vicinity of the processing module 12-2 and light irradiated from an irradiator 20c to a passage area A in the vicinity of the processing module 12-3 are not reflected from the substrate W and thus are not incident on the light receiver 21.

Further, when the substrate W is carried into the processing module 12-2, for example, as shown in FIG. 16, the light irradiated from the irradiator 20b to the passage area A in the vicinity of the processing module 12-2 is reflected at a reflection position Pb on the substrate W passing through the passage area A. The light reflected from the reflection position Pb is reflected from each of the mirror 22c and the mirror 22d and is incident on the light receiver 21. On the other hand, the light irradiated from the irradiator 20a to the passage area A in the vicinity of the processing module 12-1 and the light irradiated from the irradiator 20c to the passage area A in the vicinity of the processing module 12-3 are not reflected from the substrate W and thus are not incident on the light receiver 21.

Further, when the substrate W is carried into the processing module 12-3, for example, as shown in FIG. 16, the light irradiated from the irradiator 20c to the passage area A in the vicinity of the processing module 12-3 is reflected at a reflection position Pc on the substrate W passing through the passage area A. The light reflected from the reflection position Pc is incident on the light receiver 21. On the other hand, the light irradiated from the irradiator 20a to the passage area A in the vicinity of the processing module 12-1 and the light irradiated from the irradiator 20b to the passage area A in the vicinity of the processing module 12-2 are not reflected from the substrate W and thus are not incident on the light receiver 21.

The controller 100 controls the irradiation of light by each of the irradiators 20a to 20c to be performed at different timings and determines at which timing the light receiver 21 receives the light. When the light receiver 21 receives the light irradiated from the irradiator 20a, the controller 100 may determine that the substrate W has passed through the passage area A in the vicinity of the processing module 12-1. In addition, when the light receiver 21 receives the light irradiated from the irradiator 20b, the controller 100 may determine that the substrate W has passed through the passage area A in the vicinity of the processing module 12-2. In addition, when the light receiver 21 receives the light irradiated from the irradiator 20c, the controller 100 may determine that the substrate W has passed through the passage area A in the vicinity of the processing module 12-3.

Further, when the light receiver 21 does not receive the light irradiated from any one of the irradiators 20a to 20c, the controller 100 may determine that the substrate W has not passed through any passage area A. In the configuration illustrated in FIG. 16, the number of light receivers 21 may be reduced as compared with a conventional determination method.

Others

Further, the technology disclosed herein is not limited to the above-described embodiments, and various modifications can be made within the scope of the present invention.

For example, in each of the above embodiments, the irradiator 20 irradiates light obliquely onto the upper surface of the substrate W passing through the passage area A, but the light irradiated from the irradiator 20 may be irradiated to an area of the substrate W, in which an element is not formed, among the area of the substrate W. Thus, a phenomenon in which the light irradiated from the irradiator 20 is irregularly reflected by the element formed on the substrate W and the amount of light incident on the light receiver 21 is reduced may be prevented.

Further, when the irradiator 20 irradiates light to the substrate W passing through the passage area A, the irradiator 20 may irradiate the light to a surface opposite to a surface of the substrate W on which an element is formed. Even in this case, a phenomenon in which the light irradiated from the irradiator 20 is irregularly reflected by the element formed on the substrate W and the amount of light incident on the light receiver 21 is reduced may be prevented.

Further, it should be understood that the embodiments disclosed herein are illustrative and not restrictive in all respects. In practice, the embodiments described above may be implemented in various forms. In addition, the above-described embodiments may be omitted, substituted, and modified in various forms without departing from the scope and spirit of the appended claims.

The invention claimed is:

1. A transfer apparatus comprising:
    a transfer arm configured to transfer a substrate;
    an irradiator configured to irradiate light obliquely onto a passage area, through which the substrate passes, when the substrate is transferred by the transfer arm;
    a light receiver configured to receive light reflected from the substrate when the substrate passes through the passage area; and
    a controller configured to determine whether the substrate has passed through the passage area according to whether the light is received by the light receiver, wherein
    both the irradiator and the light receiver are disposed on the same surface side of the substrate when the substrate passes through the passage area.

2. The transfer apparatus of claim 1, comprising:
    a plurality of the light receivers; and
    a reflector configured to reflect the light irradiated from the irradiator to any one of the plurality of light receivers.

3. The transfer apparatus of claim 1, wherein
    the substrate has a first surface on which an element is formed, and
    when the substrate passes through the passage area, the irradiator irradiates the light to an area in which the element is not formed, of the first surface of the substrate.

4. The transfer apparatus of claim 1, wherein
    the substrate has a first surface on which an element is formed and a second surface opposite to the first surface, and
    when the substrate passes through the passage area, the irradiator irradiates the light to the second surface.

5. The transfer apparatus of claim 1, wherein
    the irradiator includes a first irradiator configured to irradiate light to a first partial area of the passage area and a second irradiator configured to irradiate light to a second partial area of the passage area,
    the first irradiator and the second irradiator are configured to irradiate light when the substrate is carried into a chamber, which is connected to a transfer chamber in which the transfer arm is provided, from the transfer chamber,
    the light receiver includes a first light receiver configured to receive light that is irradiated from the first irradiator and reflected from the substrate passing through the first partial area, and a second light receiver configured to receive light that is irradiated from the second irradiator and reflected from the substrate passing through the second partial area, and
    the controller controls the transfer arm such that the substrate passes through the passage area and specifies a reference position of the substrate based on a movement amount of the substrate, a time point at which the first light receiver receives the light reflected from the first partial area, and a time point at which the second light receiver receives the light reflected from the second partial area, and controls the transfer arm to carry the substrate into the chamber such that the specified reference position of the substrate is disposed at a predetermined position in the chamber.

6. The transfer apparatus of claim 5, wherein
    the light receiver further includes a third light receiver and a fourth light receiver,
    the transfer arm transfers the substrate between the transfer chamber and one of a first chamber and a second chamber that are disposed adjacent to each other in a vertical direction and connected to the transfer chamber,
    the irradiator irradiates the light to a first area and a second area, wherein the substrate passes through the first area when being transferred between the transfer chamber and the first chamber and the substrate passes through the second area when being transferred between the transfer chamber and the second chamber,
    the third light receiver receives light reflected from the substrate when the substrate passes through the first area, and
    the fourth light receiver receives light reflected from the substrate when the substrate passes through the second area.

7. The transfer apparatus of claim 1, wherein
    the light receiver includes a first light receiver and a second light receiver,
    the transfer arm transfers the substrate between a transfer chamber, in which the transfer arm is provided, and one of a first chamber and a second chamber that are disposed adjacent to each other in a vertical direction and connected to the transfer chamber,
    the irradiator irradiates the light to a first area and a second area, wherein the substrate passes through the first area when being transferred between the transfer chamber and the first chamber and the substrate passes through the second area when being transferred between the transfer chamber and the second chamber,
    the first light receiver receives the light reflected from the substrate when the substrate passes through the first area, and
    the second light receiver receives the light reflected from the substrate when the substrate passes through the second area.

8. The transfer apparatus of claim 1, wherein
    the irradiator includes:
    a first irradiator configured to irradiate light obliquely onto a first passage area through which the substrate passes when the substrate is transferred by the transfer arm; and
    a second irradiator configured to irradiate light obliquely onto a second passage area through which the substrate passes when the substrate is transferred by the transfer arm, and a reflector configured to reflect light irradiated from the first irradiator to the second passage area when the substrate is not present in the first passage area.

9. The transfer apparatus of claim 8, wherein:
the light receiver is configured to receive:
   light irradiated from the second irradiator and reflected by the substrate when the substrate passes through the second passage area, and
   light irradiated from the first irradiator and reflected by the reflector when the substrate is not present in both the first passage area and the second passage area, and
the controller is configured to determine whether the substrate has passed through the first passage area or the second passage area according to whether the light is received by the light receiver.

10. The transfer apparatus of claim 1, further comprising:
a first reflector configured to reflect light irradiated from the irradiator or light reflected by the substrate; and
a second reflector configured to reflect light reflected by the first reflector.

11. The transfer apparatus of claim 1, wherein
the transfer arm includes:
   a first transfer arm; and
   a second transfer arm disposed below the first transfer arm.

12. The transfer apparatus of claim 11, wherein:
the light receiver includes:
   a first light receiver configured to receive light irradiated from the irradiator and reflected by the substrate when the substrate, supported by the first transfer arm, passes through the passage area; and
   a second light receiver configured to receive light irradiated from the irradiator and reflected by the substrate when the substrate, not supported by the first transfer arm but supported by the second transfer arm, passes through the passage area, and
the controller is configured to determine whether the substrate has passed through the passage area according to whether the light is received by the first light receiver and the second light receiver.

13. The transfer apparatus of claim 11, wherein:
the irradiator includes:
   a first irradiator configured to irradiate light obliquely onto the passage area through which the substrate passes when the substrate is transferred by the first transfer arm; and
   a second irradiator configured to irradiate light obliquely onto the passage area through which the substrate passes when the substrate is transferred by the second transfer arm, and
the light receiver is configured to receive:
   light irradiated from the first irradiator and reflected by the substrate when the substrate, supported by the first transfer arm, passes through the passage area, and
   light irradiated from the second irradiator and reflected by the substrate when the substrate, not supported by the first transfer arm but supported by the second transfer arm, passes through the passage area.

14. A transfer method comprising:
a) irradiating light obliquely onto a passage area, through which a substrate passes, by an irradiator when the substrate is transferred by a transfer arm;
b) determining whether light reflected from the substrate is received by a light receiver when the substrate passes through the passage area; and
c) determining that the substrate has passed through the passage area when the light reflected from the substrate is received by the light receiver, wherein
the irradiator includes a first irradiator configured to irradiate light to a first partial area of the passage area and a second irradiator configured to irradiate light to a second partial area of the passage area,
the first irradiator and the second irradiator are configured to irradiate light when the substrate is carried into a chamber, which is connected to a transfer chamber in which the transfer arm is provided, from the transfer chamber,
the light receiver includes a first light receiver configured to receive light that is irradiated from the first irradiator and reflected from the first partial area, and a second light receiver configured to receive light that is irradiated from the second irradiator and reflected from the second partial area, and
the transfer method further comprises:
d) controlling the transfer arm such that the substrate passes through the passage area;
e) specifying a reference position of the substrate based on a movement amount of the substrate, a time point at which the first light receiver receives the light reflected from the first partial area, and a time point at which the second light receiver receives the light reflected from the second partial area; and
f) controlling the transfer arm to carry the substrate into the chamber such that the specified reference position of the substrate is disposed at a predetermined position in the chamber.

* * * * *